United States Patent [19]
Wiegman

[11] Patent Number: 4,476,544
[45] Date of Patent: Oct. 9, 1984

[54] CURRENT-CONTROLLED MAGNETIC DOMAIN MEMORY

[75] Inventor: Nelie J. Wiegman, Eindhoven, Netherlands

[73] Assignee: U.S. Philips Corporation, New York, N.Y.

[21] Appl. No.: 375,151

[22] Filed: May 5, 1982

[30] Foreign Application Priority Data

May 11, 1981 [NL] Netherlands ............. 8102284

[51] Int. Cl.$^3$ ............................................. G11C 19/08
[52] U.S. Cl. .................................................... 365/19
[58] Field of Search ............................. 365/19, 20, 21

[56] References Cited

U.S. PATENT DOCUMENTS 4,218,762  8/1980  Haisma et al. ............... 365/19

Primary Examiner—James W. Moffitt
Attorney, Agent, or Firm—Marc D. Schechter

[57] ABSTRACT

A current-controlled domain memory comprises a register for propagating magnetic domains in a magnetizable layer. The register comprises a meandering current-conductor pattern. The pattern can be driven by a bipolar current. The current conductors have a width of approximately one domain diameter and a meander period of approximately four domain diameters. The conductor pattern is provided with two control elements per period which generate potential wells in the magnetizable layer of a size of approximately one domain cross-section and which are arranged to center the centers of the domains on the edges of the conductor pattern when the current through the conductor pattern is zero.

24 Claims, 13 Drawing Figures

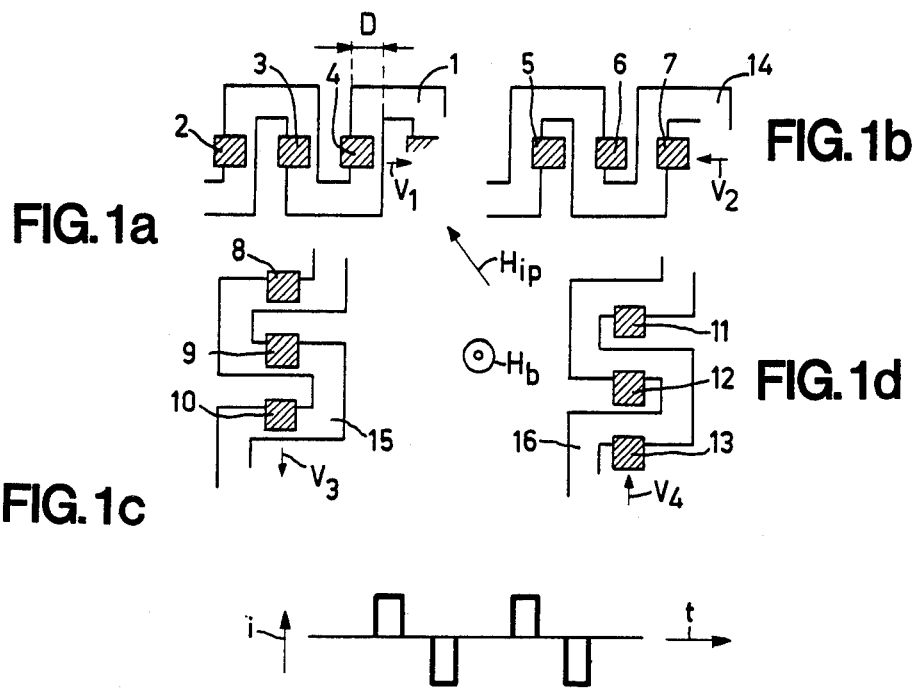
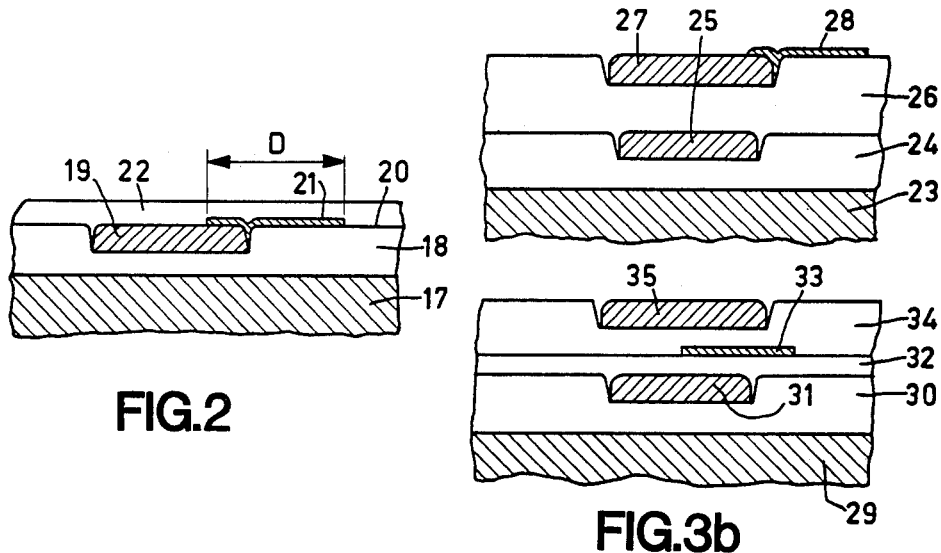

CURRENT-CONTROLLED MAGNETIC DOMAIN MEMORY

Background of The Invention

The invention relates to a register for propagating cylindrical magnetic domains in a magnetizable layer. The register is of the type in which the cylindrical magnetic domains are propagated under the influence of electric currents along a path which is defined by a meandering conductor pattern in combination with control elements arranged along the longitudinal axis of the conductor pattern. There are two control elements per period of the meandering conductor pattern, which locally generate potential wells in the magnetizable layer.

Such a register for propagating magnetic domains is known from an article by E. H. L. J. Dekker, et al entitled "Improved propagation, stretching, and annihilation of magnetic bubbles in current access devices" (Journal of Applied Physics, Volume 50, Number 3, March 1979, pp. 2277-2279). The shift register shown in FIG. 2 of the article comprises a meander-shaped current conductor controlled by a bipolar current and T-shaped elements of a nickel-iron alloy. The T-shaped elements generate potential wells at the desired places under the influence of a magnetic field in the plane of the magnetizable layer. These wells function mainly to stabilize the cylindrical magnetic domains in the layer at instants at which no current passes through the conductor.

The configuration of this known shift register, which was intended for the propagation of magnetic domains having a diameter of 4 $\mu$m, is such that the smallest detail of the masks required in the manufacture thereof is necessarily equal to approximately half a domain diameter. In the manufacture of shift registers in which domains having a diameter of 2 $\mu$m or even smaller have to be propagated, serious problems are encountered.

Moreover, the configuration is such that propagation of the domains is possible only in one direction, or in two (orthogonal) directions. As a result, information must be electrically written back into the shift register after it is read, and a major-minor loop organization is not possible.

Summary of the Invention

It is an object of the invention to provide a shift register having such a configuration that the smallest detail is not necessarily equal to half the diameter of the domains to be propagated, and which moreover may propagate domains in any desired direction.

This object is achieved by the invention in which the conductor pattern comprises a conductor which has a width of approximately one domain diameter and a meander period of approximately four domain diameters. The control elements generate potential wells which each, in the plane of the magnetizable layer, cover an area which substantially equals the cross-section of a domain. The control elements are arranged to stabilize the centers of the domains at the edges of the conductor pattern when the current through the conductor pattern is zero.

The particular configuration of the domain propagation register according to the invention makes it possible, for example, to propagate domains having cross-sections of 2 $\mu$m, and to use a meandering conductor having a period of 8 $\mu$m and a smallest detail of 2 $\mu$m. In the embodiment in which dots of a soft-magnetic alloy in combination with an in-plane magnetic field extending obliquely to the longitudinal axis of the conductor pattern are used for the control elements generating the potential wells, and in the embodiment in which dots of permanent magnetic material which are magnetized in directions oblique to the longitudinal axis of the conductor pattern are used, it is found that the shift register has a satisfactory operation as long as the edges of the deposited elements are not more than 1 $\mu$m away from the places where they should be. The effect of an incorrect alignment of the slices can be compensated for by varying the current through the conductor or (only in the former case) by varying the strength of the in-plane magnetic field. The two-mask configuration of the register according to the invention (one mask for the conductor pattern, one mask for the soft-magnetic or permanent magnetic control elements), thus does not involve serious alignment problems.

In addition to this extra advantage, a further advantage of the particular configuration of the register according to the invention is that the control elements give rise to a pseudo-drive of the domains. After switching off the current through the conductor a domain covers the remaining part (approximately $\frac{1}{3}$) of the distance to be covered under the influence of the attraction of the next control element. This is of importance for lowering the dissipation.

The control elements generating potential wells may in known manner alternatively be formed by ion-implanted regions at the surface of the magnetizable layer, or by differences in height in the magnetizable layer both in combination with an in-plane field oblique to the longitudinal axis of the conductor pattern. The control elements preferably have the shape of a square or a disc. If square, the side of the square is approximately equal to the diameter of the cross-section of a domain. If a disc, the diameter of the disc is approximately equal to the diameter of the cross-section of a domain. For example, the side or diameter of a control element may be from 0.5 D to 2 D (D being approximately equal to the diameter of a magnetic domain).

The direction of propagation of the domains depends on the position of the control elements and depends on either (i) the direction of the in-plane magnetic field if the control elements are not permanently magnetic, or (ii) the direction of magnetization of the elements if the elements are permanently magnetic. As will be described in detail hereinafter, four different directions of domain propagation are possible, for example if there is an angle of 45° (or 135°) between the direction of the in-plane field and the longitudinal axis of the conductor pattern. If such an angle is present, the basis for a major-minor loop organization has been laid.

A current-controlled magnetic domain memory having major-minor loop organization is known per se from *Bell System Technical Journal*, Volume 58, pages 1453-1540 (see in particular pp, 1499 and 1500). However, the system described there is of the type which, for propagating the domains, uses two conductor layers each comprising a hole pattern and separated by an intermediate layer.

Disadvantages of this known system are that there is a fair chance that electrical contact might be made between the two conductor layers, and that the system is sensitive to magnetic domains in which the domain wall state differs from the s=0 state. As a result, domains may deviate from the desired path during their movement. In order to mitigate this, a very strong in-plane magnetic field is necessary.

According to the invention, the disadvantages of the known current-controlled domain memory having major-minor loop organization (that is to say a main control path for the input and output of information, which path is coupled to a number of information storage loops), can be avoided by using, instead of the two conductor layers with perforations, two conductor layers of meandering conductor patterns crossing each other, two successive conductor patterns of the first layer in conjunction with two successive conductor patterns of the second layer always defining an information storage loop. In such a system, two conductor layers are present above each other only in a very small part of the memory so that the possibility of electric contact between the two conductor layers is very small. In addition the system proves to be insensitive to domains having $s \neq 0$ walls.

In the most practical embodiment of this memory system, the meandering conductor patterns of the first and second conductor layers have the same meander periods.

A domain memory according to the invention having crossing systems of meandering conductor patterns which together form the required information storage loops can be constructed in various ways.

In a first embodiment, two successive conductor patterns of the first layer define a main control path and a loop-closing path.

In a second embodiment, three successive conductor patterns of the first layer define a main control path present between two loop-closing paths, the main control path in conjunction with one loop-closing path and two successive conductor paths of the second conductor layer forming an information storage loop having a first direction of rotation, the main control path in conjunction with the other loop-closing path and two successive conductor patterns of the second conductor layer forming an information storage loop having a second direction of rotation opposite to the first.

It is particularly advantageous if registers comprising meandering conductor patterns of the above-described type are used for the propagation of the domains.

In a further embodiment of a register according to the invention, the conductor patterns comprise conductors having a width of approximately one domain diameter and a meander period of approximately four domain diameters. The conductors are each combined with two control elements per period. The control elements generate potential wells in the magnetizable layer. Each control element covers an area in the plane of the magnetizable layer which substantially equals the cross-section of a domain. Each control element is arranged to stabilize the centers of the domains at the edges of the conductor patterns when the current through the conductor pattern is zero.

If the control elements comprise discs of soft magnetic or permanent magnetic material, they may be arranged either in one plane in an intermediate layer between the first and second conductor layers, or in one plane which adjoins the free surface of the conductor layer which is farthest from the magnetizable layer.

The invention relates not only to a current-control domain memory having a major-minor loop organization, it also relates to a current-controlled domain memory having a series-parallel-series organization. In that latter case, successive conductor patterns in the first layer form a serially driven input register and a serially driven output register for magnetic domains, respectively, and the conductor patterns in the second layer form parallel driven domain movement registers.

Description of The Drawing

FIGS. 1a, 1b, 1c and 1d are schematic plan views of parts of domain propagation registers according to the invention for propagating magnetic domains in first, second, third and fouth directions, respectively.

FIG. 1e is an energization diagram in the form of a curve of electric current as a function of time.

FIG. 2 is a cross-sectional view through a domain propagation register according to the invention.

FIGS. 3a and 3b are cross-sectional views through parts of two different embodiments of a magnetic domain memory according to the invention.

Description of The Preferred Embodiments

Figure 4:
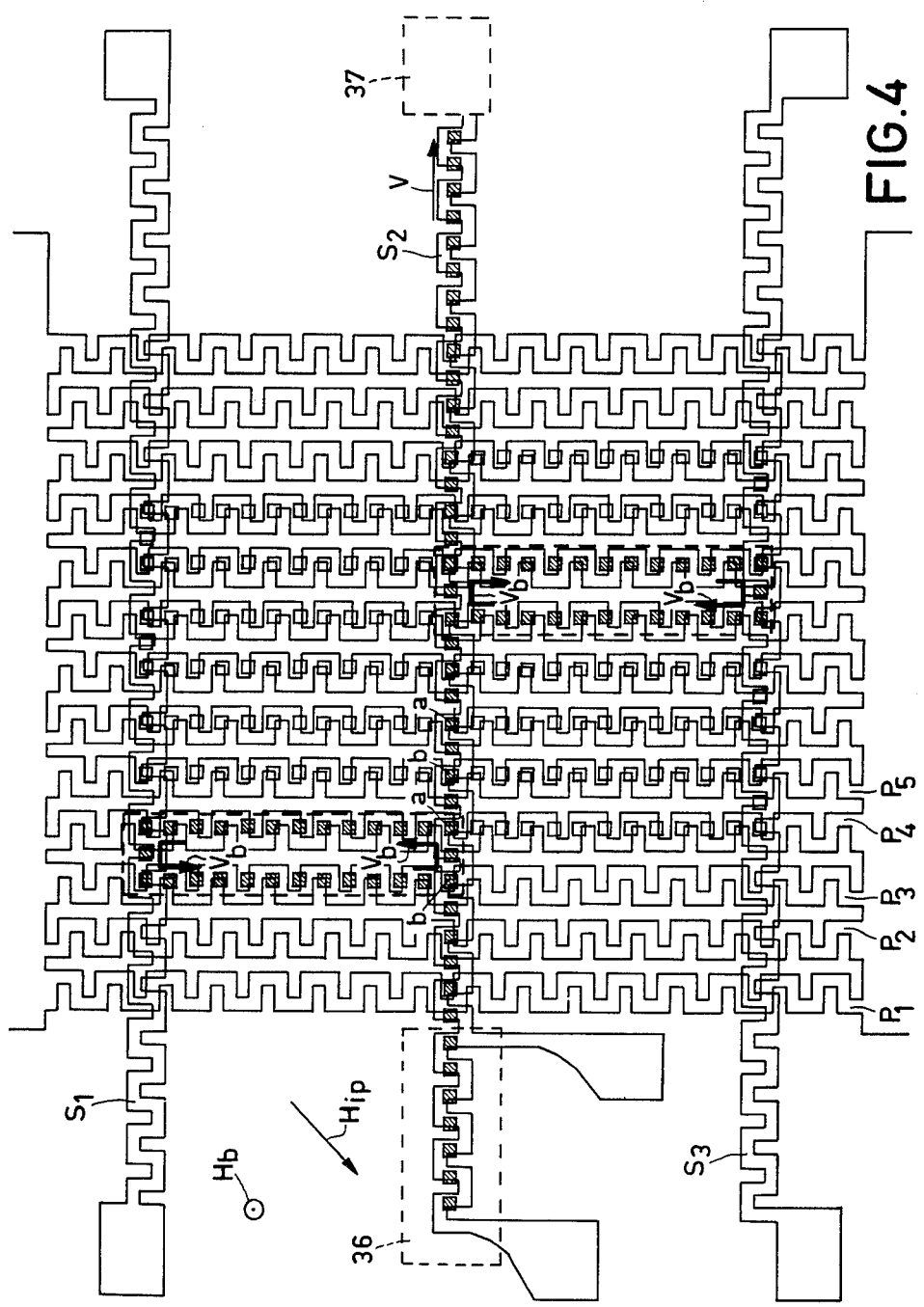
FIG. 4 is a schematic plan view of a magnetic domain memory having a major-minor loop organization according to the invention.

A meandering current conductor 1 has a conductor width D (D being approximately equal to the diameter of a magnetic domain) and a period 4 D, and is provided with softmagnetic control elements 2, 3, and 4 (see FIG. 1a). The conductor 1 and elements 2, 3 and 4 are present in an in-plane magnetic field $H_{ip}$. Conductor 1 is driven by bipolar pulses (FIG. 1e). The control elements 2, 3, and 4 in this case are squares having dimensions $D \times D$ but may alternatively be discs having a diameter D.

The direction of propagation of a magnetic domain propagated by means of the register shown in FIG. 1a, which domain is maintained under the influence of a main magnetic field $H_b$ which is transverse to the plane of the conductor, depends on the positioning of the control elements 2, 3 and 4 and the direction of the conductor relative to the direction of the inplane field $H_{ip}$. With the direction of the in-plane field $H_{ip}$ shown, the arrangements of FIGS. 1a, 1b, 1c and 1d yield four different propagation directions, $V_1$, $V_2$, $V_3$ and $V_4$ for the magnetic domains.

Under the influence of the field $H_{ip}$, the elements 2, 3, and 4 (as well as the elements 5, 6, and 7, 8, 9, and 10, and 11, 12, and 13) generate potential wells which stabilize magnetic domains at the edges of the conductor 1 (or the conductors 14, 15, and 16) when no current passes therethrough.

So with the configurations shown in FIGS. 1a to 1d propagation in any desired direction is possible. In addition, the smallest detail in the patterns is as large as possible. The smallest detail is equal to D.

FIG. 2 is a cross-sectional view of a magnetizable layer 17 in which magnetic domains can be propagated. The layer 17 is covered with a layer 18 of a nonmagnetic, electrically nonconductive material, for example $SiO_x$ ($1 \leq x \leq 2$). Electrical conductors of the type shown in FIGS. 1a to 1d are embedded in the layer 18. One representative thereof is denoted by reference numeral 19. The conductor 19 may consist, for example, of A1.

By embedding the conductor 19 in the layer 18 it can be ensured that a flat surface 20 is formed on which soft magnetic control elements can be provided. One such control element is denoted by reference numeral 21. A passivating layer 22 which may consist, for example, of $SiO_x$ ($1 \leq x \leq 2$) is provided over the element 21.

The thickness of the control element 21, which may consist, for example, of a nickel-iron alloy (such as permalloy), is much smaller than is usual for control elements: 100 nm instead of 400 nm. The length and width of the element are approximately $D \times D$ instead of having a length exceeding D, as is described in the above-cited article by Dekker et al. As a result, the potential well caused by element 21 is so small that "stripping-out" (changing the domain cross-section from circular into an elongated cross-section in the direction of propagation) is prevented. Stripping-out would have for its result that the operational margin of the configurations shown in FIGS. 1b and 1d would be much smaller than that of the configurations 1a and 1c.

The depth of the potential well caused by element 21 can be accurately adjusted by 1. varying the thickness of the element;
2. varying the distance between element 21 and magnetizable layer 17 (either by varying the thickness of the layer 18 or by providing an extra intermediate layer from 50 to 150 nm thick between element 21 and layer 18; and
3. varying the strength of the in-plane magnetic field $H_{ip}$.

All this makes it possible to optimize the driving force with which a magnetic domain is attracted toward the element 21 and the pinning force which occurs when a domain is pulled off of the element 21 under the influence of current through the conductor 19, so that minimum propagation current is required.

The distance between the layer 17 and conductor 19, as well as the thickness of conductor 19, will generally be a few 100 nm, for example 400 nm. If it is necessary for the operation of the system, the distance may be made smaller. In order to prevent mechanical stresses in the layer 18 a synthetic resin, for example a polyamide, may alternatively be used as a material for the layer 18. A layer of synthetic resin can better compensate for mechanical stresses, if any, than a (thin) $SiO_x$ layer.

A very suitable technology for manufacturing the layer structure shown in the cross-sectional view of FIG. 2 is the planar technology described by T. W. Bril, et al in their article entitled "Planar Processing for Double Conductor Current Access Devices" (Paper 77 of the E.C.S. Spring Meeting in St. Louis 11-16 May, 1980).

FIGS. 3a and 3b are cross-sectional views of two layer structures which may be employed when two conductor layers are provided.

FIG. 3a shows a detail of a cross-sectional view through a control structure which is present above magnetizable layer 23 in which cylindrical magnetic domains can be propagated. The control structure comprises a conductor 25 which is embedded in a spacer layer 24 and a conductor 27 which is embedded in a spacer layer 26. The conductors 25 and 27 may form part of meandering conductor patterns which cross each other. A control element 28 of permalloy is present partly on the layer 26 and partly on the conductor 27.

FIG. 3b shows a detail of an alternate construction of a control structure which in this Figure is present above a magnetizable layer 29 and comprises a conductor 31 embedded in a spacer layer 30 and a conductor 35 embedded in a spacer layer 34. A control element 33 of permalloy is separated from the layer 30 by a spacer layer 32.

FIG. 4 shows a 3-layer domain memory having a major-minor loop organization and comprising two conductor layers and a permalloy layer for the control elements.

In the first layer, three current-controlled propagation paths for cylindrical magnetic domains, socalled "bubbles", are provided. These propagation paths are designated $S_1$, $S_2$ and $S_3$. The meandering paths $P_1$, $P_2$, $P_3$, $P_4$, $P_5$ . . . are provided in the second layer, and permalloy control elements indicated by shaded squares are provided in the third layer. The meander $S_2$ serves for reading-in and reading-out the information. All meanders provided in the first and the second conductor layer together constitute the minor loops in which the information storage takes place.

A minor loop (see FIG. 4) is formed by two successive meanders in the second layer together with parts of the conductors $S_2$ and $S_1$ for an upper minor loop, and parts of $S_2$ and $S_3$ for a lower minor loop.

By driving $S_2$ the information is transported from a generator 36 to the memory (one bubble in each period of the meander). When the bubbles have arrived at the positions denoted by a and b, the driving of $S_2$ is discontinued and the conductors $P_1$, $P_2$, $P_3$, $P_4$, $P_5$, etc. are driven for one period to move the bubbles in the directions $V_b$. The bubbles are now moved in the minor loops over one bit place: the bubbles in the positions "a" move upward, those in the positions "b" move downwards. Simultaneously, information from the minor loops becomes positioned in the in/out path $S_2$.

Information from the upper minor loops comes into the "b"-places and that from the lower loops into the "a"-places. This information is conducted to a detector 37 simultaneously with reading-in the next information. Read-in and read-out occurs at a frequency f.

Figures 5A, 5B:
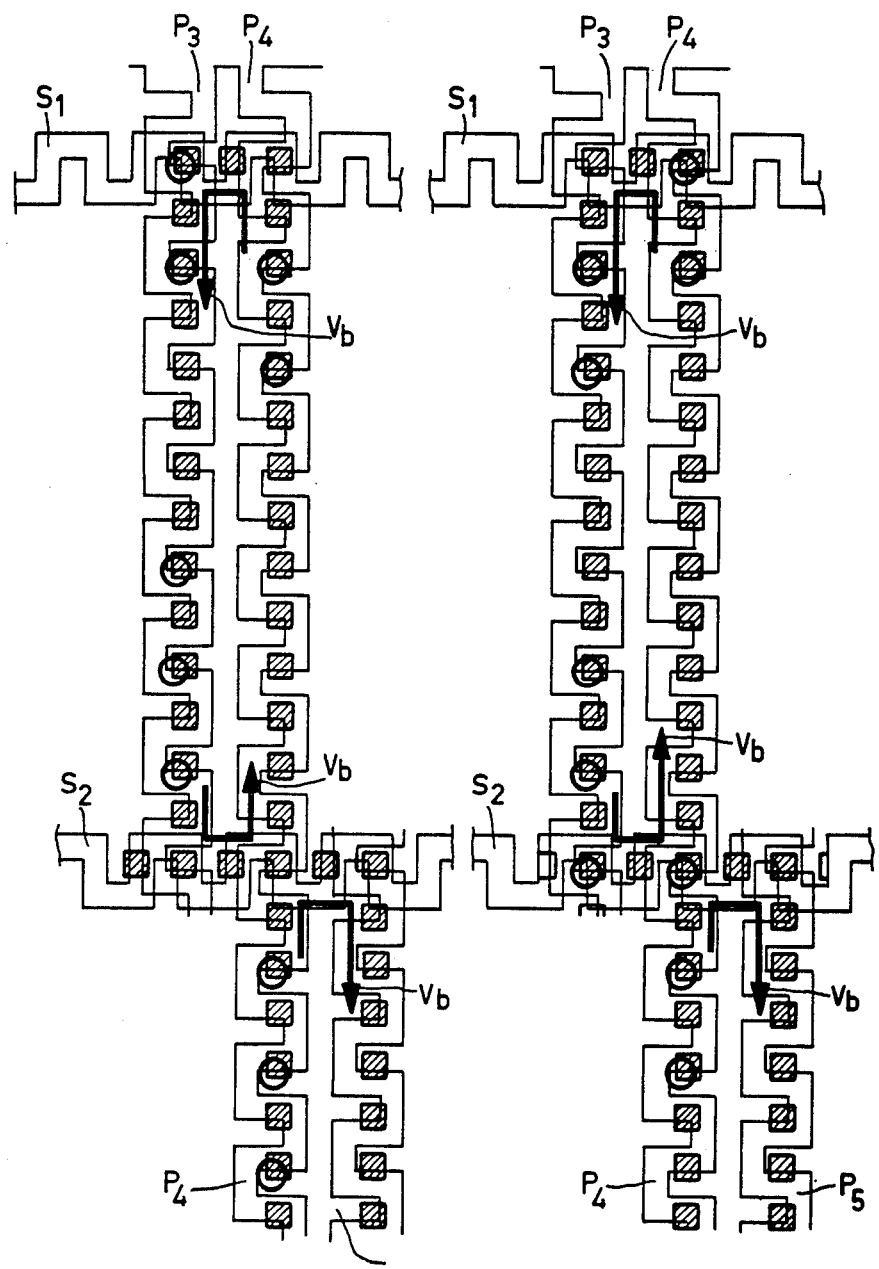
FIGS. 5a, 5b, 5c and 5d each schematically show a part of FIG. 4 on an enlarged scale.
Figures 5C, 5D:
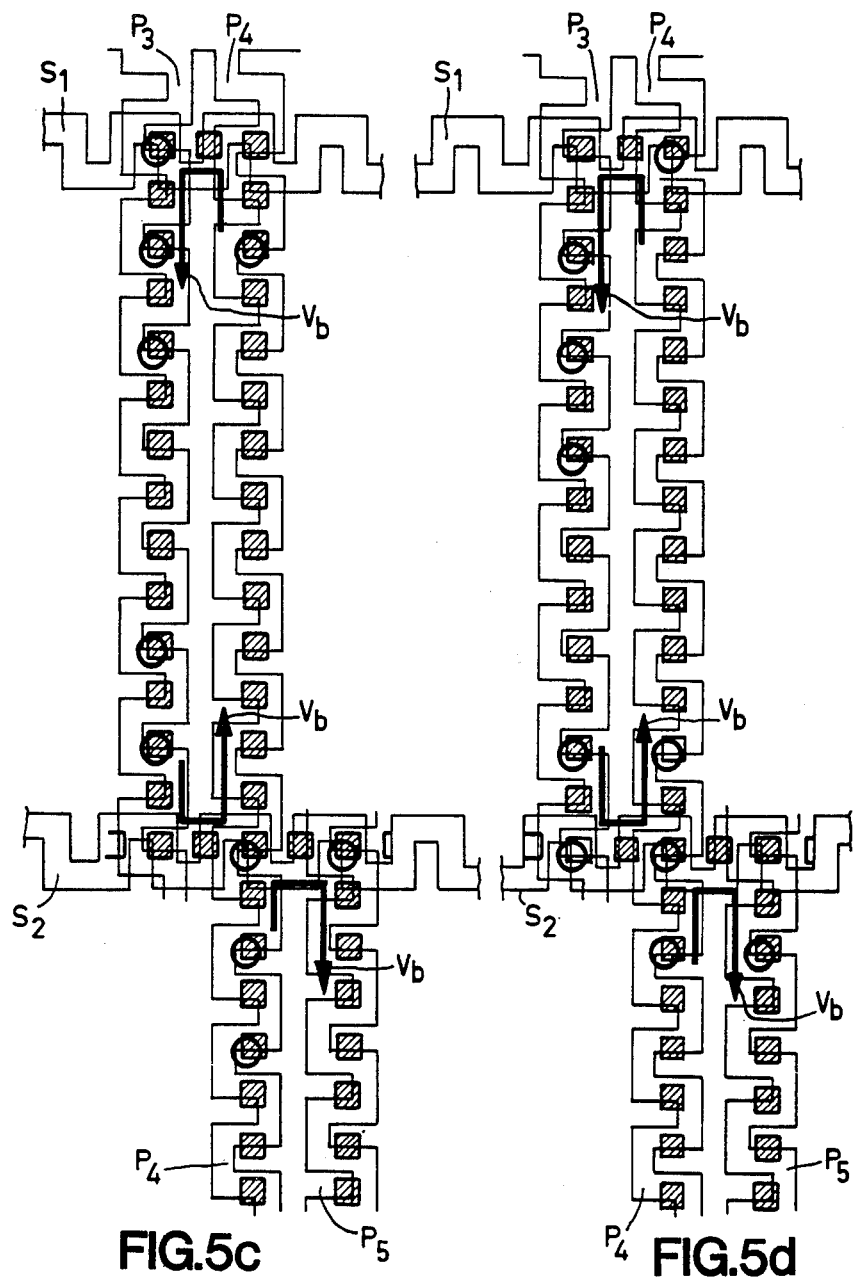

In order to circulate the bubbles in the minor loops, the S-conductors are energized for one period ("positive pulse + negative pulse") and the P− conductors for one period (= positive pulse + negative pulse), alternately. The movement of bubbles in direction $V_b$ through a minor loop is followed in FIGS. 5a to 5d. The starting situation is shown in FIG. 5a with reference to two (one upper and one lower) minor loops. After driving the P-conductors for one period the situation as shown in FIG. 5b is obtained. Energization of the conductors $S_1$, $S_2$ and $S_3$ is then carried out for one period resulting in the situation shown in FIG. 5c. Again driving the P-conductors for one period yields the situation shown in FIG. 5d. The circulation frequency in the minor loops is f/2. A minor loop of m periods may at most contain (m−2) bits of information.

It is to be noted that:

The first and second conductor layers may in principle be interchanged.

Searching in the minor loop for a block of information which is to be read occurs at half the frequency f. When this block of information reaches the in/out transfer path, reading-out of the whole block as well as reading-in of the possible new information occurs at frequency f.

In a series-parallel-series organization the only difference is that successive meanders $P_1$, $P_2$, etc. have the same configurations so that the bubbles are driven in parallel along the meanders of the second layer.

What is claimed is:

1. A register for propagating cylindrical magnetic domains having centers and diameters, said register comprising:
a substantially planar magnetizable layer in which the magnetic domains are situated; and
a propagation layer on the magnetizable layer for driving the magnetic domains in the magnetizable layer, the propagation layer comprising:
an electrically-conductive conductor pattern having edges and having a longitudinal axis, said axis defining trajectories for the magnet domains, said pattern following meandering paths having meander periods; and
a plurality of control elements arranged on the longitudinal axis of the conductor pattern, two control elements per meander period, said control elements generating, in operation, potential wells in the magnetizable layer;
characterized in that:
the conductor pattern comprises a conductor having a width of approximately one domain diameter, and the conductor pattern has a meander period of approximately four domain diameters; and
the control elements generate potential wells in the magnetizable layer, each well covering an area substantially equal to the area covered by a cross-section through a magnetic domain in the plane of the magnetizable layer, said control elements being arranged to locate the potential wells to stabilize the centers of the magnetic domains at the edges of the conductor pattern when there is no electric current flowing through the conductor pattern.

2. A register as claimed in claim 1, further comprising means for providing the conductor pattern with a bipolar driving current.

3. A register as claimed in claim 2, characterized in that the control elements comprise planar dots of soft magnetic material having, in operation, a magnetization direction extending obliquely to the longitudinal axis of the conductor pattern.

4. A register as claimed in claim 3, characterized in that the control elements are square with a side of the square being approximately equal to 0.5 to 2 times the diameter of the magnetic domains to be propagated thereby.

5. A register as claimed in claim 4, characterized in that the side of the control element is approximately equal to the diameter of the magnetic domains to be propagated.

6. A register as claimed in claim 3, characterized in that the control elements are circular with a diameter of the circle being approximately equal to 0.5 to 2 times the diameter of the magnetic domains to be propagated thereby.

7. A register as claimed in claim 6, characterized in that the diameter of the control element is approximately equal to the diameter of the magnetic domains to be propagated.

8. A register as claimed in claim 2, characterized in that the control elements comprise planar dots of permanent magnetic material having a magnetization direction extending obliquely to the longitudinal axis of the conductor pattern.

9. A register as claimed in claim 8, characterized in that the control elements are square with a side of the square being approximately equal to 0.5 to 2 times the diameter of the magnetic domains to be propagated thereby.

10. A register as claimed in claim 9, characterized in that the side of the control element is approximately equal to the diameter of the magnetic domains to be propagated.

11. A register as claimed in claim 8, characterized in that the control elements are circular with a diameter of the circle being approximately equal to 0.5 to 2 times the diameter of the magnetic domains to be propagated thereby.

12. A register as claimed in claim 11, characterized in that the diameter of the control element is approximately equal to the diameter of the magnetic domains to be propagated.

13. A current-controlled magnetic domain memory device for storing and propagating magnetic domains, said memory device comprising:
a substantially planar magnetizable layer in which the domains are situated;
a first propagation layer on the magnetizable layer for driving the magnetic domains in the magnetizable layer, the first propagation layer comprising at least two parallel electrically-conductive meandering conductor patterns having edges and axes;
a second propagation layer on the first propagation layer for driving the magnetic domains in the magnetizable layer, the second propagation layer comprising at least two parallel electrically-conductive meandering conductor patterns having edges and axes, the conductor patterns of the first layer crossing the conductor patterns of the second layer; and
a nonmagnetic, electrically nonconductive intermediate layer between the first and second propagation layers;
characterized in that two successive conductor patterns in the first layer and two successive conductor patterns in the second layer define an information storage loop in which magnetic domains can be propagated completely around the loop.

14. A magnetic domain memory device as claimed in claim 13, characterized in that the meandering conductor patterns of the first and second propagation layers have meander periods which are equal to one another.

15. A magnetic domain memory device as claimed in claim 14, characterized in that two successive conductor patterns in the first layer define a main control path and a loop-closing path, respectively.

16. A magnetic domain memory device as claimed in claim 14, characterized in that:
three successive conductor patterns in the first layer define a main control path and two loop-closing paths, the main control path being located between the two loop-closing paths;
the main control path, one loop-closing path, and two successive conductor patterns in the second propagation layer define a first information storage loop having a first direction of propagation; and
the main control path, the other loop-closing path, and two successive conductor patterns in the second propagation layer define a second information storage loop having a second direction of propagation opposite to the first.

17. A magnetic domain memory device as claimed in claim 16, characterized in that the device further comprises:
a domain generator; and
a domain detector; and the main control path has a first end connected to the domain generator and a second end connected to the domain detector.

18. A magnetic domain memory device as claimed in claim 17, characterized in that:
the conductor patterns comprise conductors having widths of approximately one domain diameter and the conductor patterns have meander periods of approximately four domain diameters;
the propagation layers further comprise two control elements per meander period, said control elements generating potential wells in the magnetizable layer, each well covering an area substantially equal to the area covered by a cross-section through a magnetic domain in the plane of the magnetizable layer, said control elements being arranged to locate the potential wells to stabilize the centers of the magnetic domains at the edges of the conductor patterns when there are no electric currents flowing through the conductor patterns.

19. A magnetic domain memory device as claimed in claim 18, characterized in that:
the control elements comprise planar dots of soft magnetic material having, in operation, a magnetization direction extending obliquely to the axis of the conductor pattern.

20. A magnetic domain memory device as claimed in claim 19, characterized in that the control elements are arranged in the intermediate layer between the first and second propagation layers.

21. A magnetic domain memory device as claimed in claim 19, characterized in that the control elements are arranged on the second propagation layer.

22. A magnetic domain memory device as claimed in claim 18, characterized in that the control elements comprise planar dots of permanent magnetic material having a magnetization direction extending obliquely to the axis of the conductor pattern.

23. A magnetic domain memory device as claimed in claim 22, characterized in that the control elements are arranged in the intermediate layer between the first and second propagation layers.

24. A magnetic domain memory device as claimed in claim 22, characterized in that the control elements are arranged on the second propagation layer.

* * * * *